(12) United States Patent
Fukuda et al.

(10) Patent No.: US 7,089,482 B2
(45) Date of Patent: Aug. 8, 2006

(54) DATA REPRODUCTION DEVICE

(75) Inventors: Katsuhiko Fukuda, Kato (JP); Toru Fujiwara, Kato (JP); Akiyoshi Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 854 days.

(21) Appl. No.: 10/102,832

(22) Filed: Mar. 22, 2002

(65) Prior Publication Data

US 2003/0081933 A1    May 1, 2003

(30) Foreign Application Priority Data

Nov. 1, 2001    (JP) ............................. 2001-336802

(51) Int. Cl.
*H03M 13/03*    (2006.01)
(52) U.S. Cl. .................................................. 714/795
(58) Field of Classification Search ................ 714/795; 375/262, 341
See application file for complete search history.

(56) References Cited

U.S. PATENT DOCUMENTS

| | | | | |
|---|---|---|---|---|
| 4,015,238 A | * | 3/1977 | Davis | 714/792 |
| 5,905,742 A | * | 5/1999 | Chennakeshu et al. | 714/792 |
| 6,788,750 B1 | * | 9/2004 | Reuven et al. | 375/341 |

FOREIGN PATENT DOCUMENTS

JP    11-330985    11/1999

OTHER PUBLICATIONS

Japanese Office Action issued in priority Japanese Application No. 2001-336802 dated Mar. 28, 2006.

* cited by examiner

*Primary Examiner*—Joseph Torres
(74) *Attorney, Agent, or Firm*—Staas & Halsey LLP

(57) ABSTRACT

A data reproduction device in conformity to Viterbi decoding includes an inverted-selected path generation part for receiving a selected path and an inverted candidate, selecting and modifying the selected path corresponding to the inverted candidate so as to produce a inverted-selected path that is an inverted version of the selected path, and outputting a number of the inverted-selected paths in parallel, the number corresponding to a number of the inverted candidates selected for the selected path of a predetermined data length and a second candidate data generation part for generating second candidate data from the inverted candidate. The device further includes a data selection part for selecting between the first and the second candidate data based on error detecting results.

11 Claims, 14 Drawing Sheets

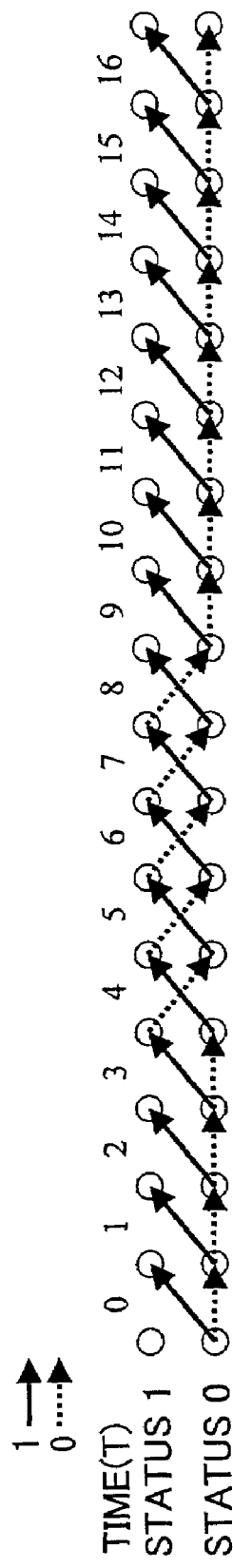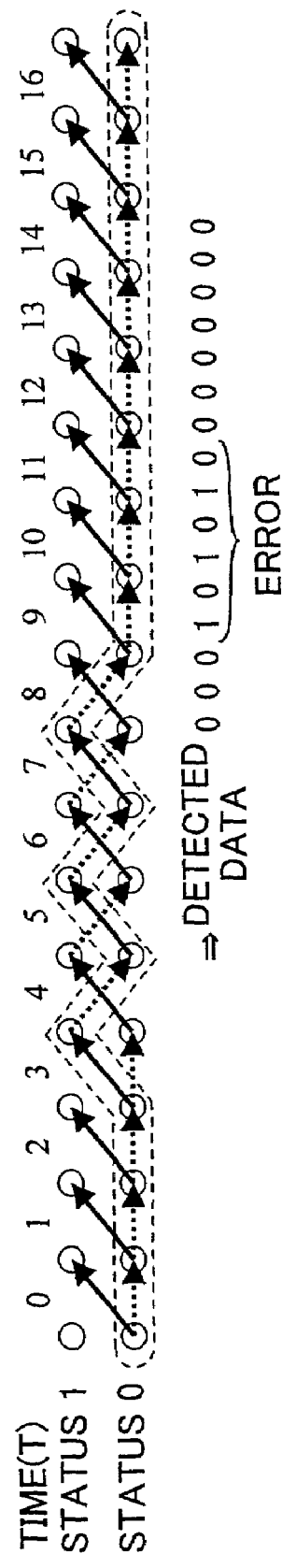

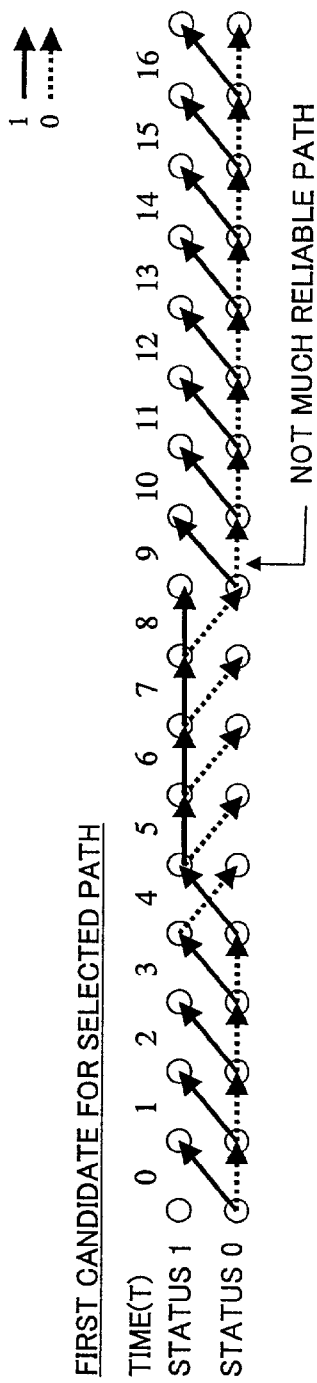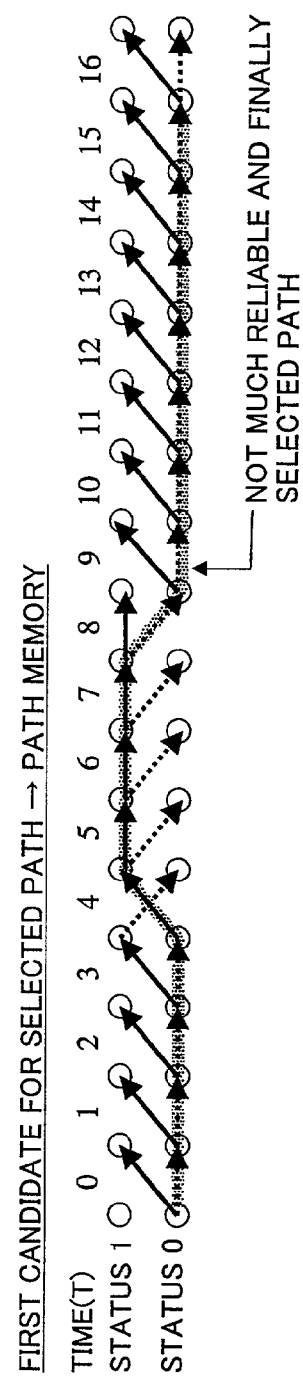

FIG.16

| Fcd_ok | Prtyok[10:0] | Enb[10:0] |
|---|---|---|
| 1 | XX_XXXX_XXXX_X | 00_0000_0000_1 |
| 0 | 00_0000_0000_0 | 00_0000_0000_1 |
| 0 | XX_XXXX_XXXX_1 | 00_0000_0000_1 |
| 0 | XX_XXXX_XXX1_0 | 00_0000_0001_0 |
| 0 | XX_XXXX_XX10_0 | 00_0000_0010_0 |
| 0 | XX_XXXX_X100_0 | 00_0000_0100_0 |
| 0 | XX_XXXX_1000_0 | 00_0000_1000_0 |
| 0 | XX_XXX1_0000_0 | 00_0001_0000_0 |
| 0 | XX_XX10_0000_0 | 00_0010_0000_0 |
| 0 | XX_X100_0000_0 | 00_0100_0000_0 |
| 0 | XX_1000_0000_0 | 00_1000_0000_0 |
| 0 | X1_0000_0000_0 | 01_0000_0000_0 |
| 0 | 10_0000_0000_0 | 10_0000_0000_0 |

DATA REPRODUCTION DEVICE

BACKGROUND OF THE INVENTION

1. Field of the Invention

The present invention generally relates to a data reproduction device reproducing data stored in a storage medium such as an optical disk, and more particularly relates to the data reproduction device reading signals from the storage medium in which the data have been stored and reproducing the data from the read signals.

2. Description of the Related Art

A magneto-optical disk drive is one of the most common data reproduction devices and is intended to be applied to various fields such as storage/reproduction of image information, storage/reproduction of many kinds of coded data in a computer, and so on. The magneto-optical disk drive is required to be able to record data with much higher density on a magneto-optical disk and reproduce the recorded data with much higher accuracy from the disk so that it can achieve very high-capacity recording.

For example, one of the known methods for recording and accurately reproducing the data on/from the disk consists of modulating the data to be recorded to a partial response (PR) waveform in order to derive recording signals from the data, recording the derived recoding signals on the magneto-optical disk, reading and sampling signals from the magneto-optical disk at a predetermined sampling period, and detecting the most likelihood (ML) data using a most likelihood detector such as a Viterbi detector.

FIG. 1 shows a schematic diagram of the conventional Viterbi detector. The Viterbi detector 100 is shown to include a branch metric calculation unit (hereinafter referred to as BM) 101, an add-compare-select unit (hereinafter also referred to as ACS) 102, a path metric memory (hereinafter also referred to as PMM) 103, and a path memory (hereinafter also referred to as PM) unit 104.

In the conventional Viterbi detector 100, which is utilized for a data reproduction system in the magnet-optical disk drive, the BM 101 receives a sampled value YT corresponding to a reproduced signal read from the magnet-optical disk and derives a branch metric value (hereinafter also referred to as BM value) by calculating the difference between the sampled value YT and an expected value. It is noted that the expected value depends on the partial response waveform that has been used in recording the data on the disk, and represents a value that the reproduced signal is supposed to have. Once one sampled value YT is provided to the BM 101, the BM value is calculated for each of the expected values.

The ACS 102 adds thus derived BM value to a path metric value (hereinafter also referred to as PM value) that has been generated at an immediately preceding clock cycle in order to produce the added PM value, and compares the added PM value with another added PM value, which was calculated in parallel with the added PM value. Thereafter, the ACS 102 selects the lower PM value from the added PM value and the preceding PM value to produce a new PM value and stores the new PM value in the PMM 103. As a result, the PM value represents an accumulated value of the BM values. Selecting the lower PM value corresponds to a selection of a state transition path. That is to say, the ACS 102 keeps on selecting the state transition path, which minimizes the PM value.

The PM 104 receives the data (particularly, binary data) representing thus selected state transition path from the ACS 102. The PM 104 sequentially shifts the data corresponding to the respective selected state transition path, whereas the PM 104 rejects the data corresponding to the state transition path that has not been selected with respect to the connectivity of the state transition, and thus sequentially selecting the possible data. In this way, the PM 104 produces the data corresponding to a survivor or a survival path as the detected data.

In the above-described conventional detecting, the data to be recorded are modulated to the recording signals in the form of the partial response waveform and the Viterbi detector detects the most likelihood data, so that the data can be accurately reproduced from the magneto-optical disk on which the data has been recorded with the high density. This type of the record/reproduction method is known as partial response most likelihood detecting (hereinafter also referred to as PRML).

However, the PRML method has a disadvantage as described later.

For example, it is assumed that the signals derived by modulating the data comprising a 1T sequential pattern (i.e. "10101010 . . . ") in accordance with the partial response waveform of PR(1,1) are recorded on the magneto-optical disk. The sampled value of the signal reproduced from the magneto-optical disk using the PRML method is shown in FIG. 2. The signal recorded on the disk according to the PR(1,1) corresponds to a sequence of the bits formed by adding one bit sequence of the data to the other bit sequence of the data being delayed by 1 bit. This recoding system can be conventionally written as (1+D). Then, the sampled value of the reproduced signal corresponding to the recorded signal is represented by the bit sequence of "00001111110000000" as shown in FIG. 2, if the original data is "00001010100000000."

FIG. 3 shows the relation between the path selected by the ACS 102 and states of coding when the sampled value of FIG. 2 is applied to the Viterbi detector 100 of FIG. 1.

In FIG. 3, the various states are illustrated using circles and state transition paths are illustrated using arrows. In this example, there exist two types of coding states, such as "0" and "1", and four types of state transition paths, each of which represents the state transition from status "0" to status "0", from status "0" to status "1", from status "1"to status "0", and from status "1" to status "1." The arrowed solid line represents the state transition path directing toward the status "1" and the arrowed broken line represent the state transition path directing toward the status "0."

With the sequential selection of the path by the ACS 102, the survivor/survivors is/are established and stored in the PM 104. For example, during the time interval from 4T to 9T in time series, the no-merging status occurs where neither of the paths represented by the solid line nor by the broken line can be selected, and thereafter the merging status occurs where either one of the paths is selected. As a result of that, the survivor can be formed, which is encircled by a dotted curve, as shown in FIG. 4. The survivor is formed by detected data described by the sequence of "0000101010000000". This detected data are equivalent to the original data.

However, the physical sampled values may be deviated from the ideal sampled values of FIG. 2 due to the effect caused by noise and so on. An example of this deviation is shown in FIG. 5 where the sampled value at the time of 9T has been reduced due to the noise. In this example, the relation between the selected path and the states produced in the Viterbi detector 100 is shown in FIG. 6, where the Viterbi detector 100 receives the sequence of the sampled values of FIG. 5. The path of FIG. 6 differs from that of FIG. 3 in that each of the sampled values at the time of 9T differs from each other. It is noted that in this case the number of error bits included in the detected data is 1, however, the number of error bits may be more than one.

When the Viterbi detector 100 is provided with the sampled values as shown in FIG. 5, the PM 104 ultimately selects the path encircled by the dotted curve as the survivor, as shown in FIG. 7. In FIG. 7, the path from the time of 3T to 9T differs from the path corresponding to the desired detected data of FIG. 4. It can be seen that the one error for the path at the time of 9T introduces 6 error bits in the detected data.

As described above, the conventional Viterbi detector has a disadvantage that the selected path changes due to any errors included in the sampled value, because the Viterbi detector establish the path on the basis of the connectivity of the state transition, and continuously adds the error to the established path, that is to say, the survivor.

SUMMARY OF THE INVENTION

Accordingly, it is an object of the present invention to provide a data reproduction device for more efficiently detecting data without being susceptible to noise.

In order to achieve the above object of the present invention, a data reproduction device reproducing data from a recording medium including:

a sampling part sampling a reproduced signal in a form of a partial response waveform from the recording medium at a predetermined period; and a decoding part in conformity to Viterbi decoding, receiving the sampled signal, calculating a branch metric value on the basis of an expected value determined by the partial response waveform and the sampled value, calculating a path metric value based on the branch metric value, selecting a path corresponding to a transition status of the data on the basis of comparison of the path metric values, and reproducing the data in accordance with the selected path;

the decoding part further includes:

a reliability calculation part calculating a reliability of the selected path based on the path metric values being compared in selecting the path;

a first candidate data generation part for generating first candidate data based on the selected path using a predetermined rule;

an inverted candidate detection part selecting as an inverted candidate the path of which the reliability calculated in the reliability calculation part is less than a predetermined value among the selected paths corresponding to the first candidate data;

an inverted-selected path generation part receiving the selected path and the inverted candidate selected by the inverted candidate detection part, selecting and modifying the selected path corresponding to the inverted candidate so as to produce a inverted-selected path that is an inverted version of the selected path, and outputting a number of the inverted-selected paths in parallel, the number corresponding to a number of the inverted candidates selected for the selected path of a predetermined data length;

a second candidate data generation part generating second candidate data from the inverted candidate output from the inverted-selected detection part using the predetermined rule and outputting the generated second candidate data in parallel;

a error detection part detecting any errors present in the first and the second candidate data in accordance with a predetermined error detecting; and a data selection part selecting between the first and the second candidate data based on the error detecting results from the error detection part.

According to the above-described data reproduction device, the first candidate data are generated from the selected path. The inverted candidate, whose reliability is less than the predetermined value, is selected from the selected paths, and the inverted-selected paths are generated such that the number of the inverted-selected paths corresponds to the number of the inverted candidates selected for the selected path of the predetermined data length. Then the error detecting is applied to the first candidate data and the second candidate data and either of the first and the second candidate data are selected as the output data on the basis of the results of error detecting.

The reliability is information representing propriety of the selected path, which is based on the comparison of the path metric values and depending on the path metric values being compared.

In the data reproduction device, the reliability calculation part includes a difference value calculation part for calculating a difference of the path metric values so as to produce information representing the reliability.

The path is selected based on the comparison of the path metric values, so that the difference between the path metric values being compared can represent the reliability for the propriety of the selected path. As the difference between the path metric values increases, the more accurately the path can be selected.

In the data reproduction device, the inverted-selected path generation part is configured to produce the inverted-selected path that reaches the same transition status as that of the selected path to be modified.

Furthermore, in the data reproduction device, the inverted-selected path generation part include:

a predetermined number of output-ends;

an output specifying part specifying the output-ends in a predetermined sequential order at the time of receiving the inverted candidate from the inverted candidate detection part so as to sequentially output the inverted-selected path; and a path-inverting part modifying the selected path corresponding to the inverted candidate so as to produce the inverted version of the selected path.

In addition, in the data reproduction device where the inverted-selected path generation part is provided with the predetermined number of the output-ends, the second candidate data generation part includes data generation circuits, each being connected to the corresponding output-end of the inverted-selected path generation part, and each of the data generation circuits generates the second candidate based on the inverted-selected path received from the inverted-selected path generation part via the corresponding output-end.

According to the above-described data reproduction device, the first candidate data are generated based on the selected path, which are selected in conformity to the predetermined rule and the second candidate data are generated based on the inverted-selected path, which is derived from the low reliable selected path by modifying the low reliable selected path. And then either one of the first and the second candidate data are selected on the basis of the error detection results for the first and the second candidate data and output as the decoded data. Therefore, since the data reproduction device produces the output data in consideration of much larger number of the selected paths, the data reproduction device can detect and reproduce the data more efficiently without being susceptible to the noise.

Furthermore, in the data reproduction device, the data selection part is provided with a look up table representing the relation between the error detecting results for the first and the second candidate data and the candidate data to be selected and is configured to select and output the candidate data depending on the error detecting results from the error detection part.

This data reproduction device can easily determine the candidate data to be delivered as the output data.

In the data reproduction device, the data selection part is configured to select the first candidate data when the error detection part detects the error in the entire first and second candidate data.

This data reproduction device can prohibit the accuracy of the reproduced data from being reduced in contrast to the conventional Viterbi detector.

Furthermore, in the data reproduction device, the data selection part is configured to select the first candidate data depending on a given control signal and independent of the error detecting results from the error detection part.

In this case, it is advantageous that the data reproduction device can be easily reconstructed as the data reproduction device using the conventional Viterbi detector.

The given control signal may be supplied from a host system such as a computing device, to which the data reproduction device is connected, input by a manual operation of a user, or automatically generated in the data reproduction device when a certain condition, for example, the conditions concerning the type of the recording medium, is satisfied.

In the data reproduction device, the data selection part may be configured to select the first candidate data irrelevant to the error detecting results for the second candidate data from the error detection part when the error detection part detects no errors in the first candidate data.

Alternatively, in the data reproduction device, the data selection part may be configured to select one of the second candidate data in accordance with a predetermined priority when the error detection part detects the error in the first candidate data and detects no errors in a plurality of the second candidate data.

The error detection part is not limited to a particular error detection method, but may use any methods, which can find fault included in the bit data.

Therefore, in the data reproduction device, the error detection part may be configured to detect the errors in the first and the second candidate data using parity check.

BRIEF DESCRIPTION OF THE DRAWINGS

Other objects, features and advantages of the present invention will become more apparent from the following detailed description when read in conjunction with the accompanying drawings, in which:

FIG. 6 illustrates another example of the relation between the selected path in the ACS and the states where the produced signal is susceptible to the noise;

FIG. 7 illustrates a further example of the survivor established in a PM where the produced signal is susceptible to the noise;

FIGS. 11A and 11B illustrate the relation between a selected path in the ACS and a last selected path;

FIG. 16 illustrates an example of the input-output relation of a parity decoding circuit in the path judgment circuit of FIG. 15.

DETAILED DESCRIPTION OF THE PREFERRED EMBODIMENTS

In the following, embodiments of the present invention will be described with reference to figures.

It is noted that although the later various embodiments of the present invention apply a PRML method of a PR(1,1) class to record and reproduction of the data, the present invention is not limited to the application of the PRML of the PR(1,1) class, and that any other PRML methods, for example, including PR(1,2,1), PR(1,3,3,1) and PR(1,0,−1) classes may be applied to the record and reproduction of the data.

Figure 8:
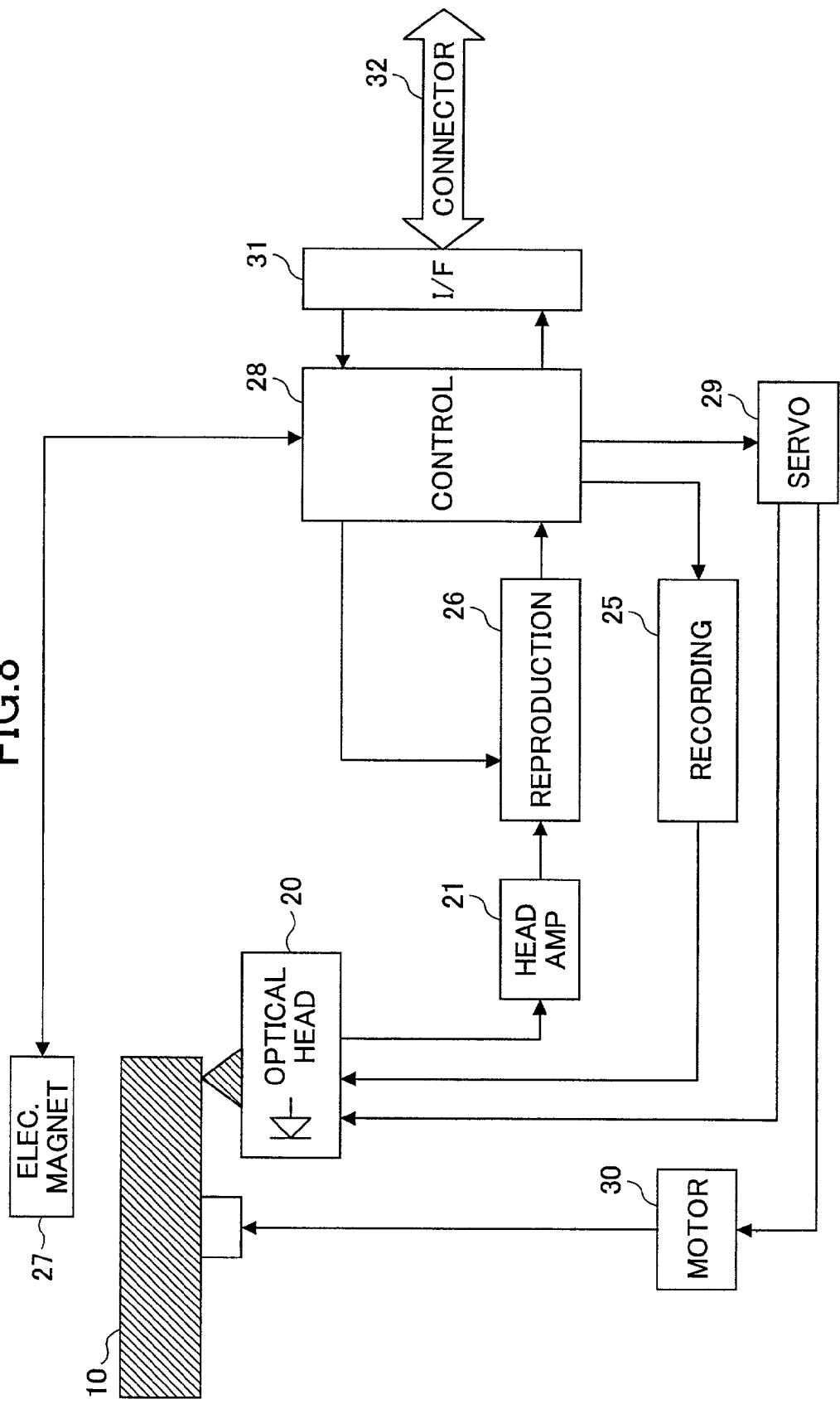
FIG. 8 shows a schematic diagram of a magneto-optical disk drive using a data reproduction device according to an embodiment of the present invention.

Referring to FIG. 8, a magneto-optical disk drive including a data reproduction device according to one embodiment of the present invention is illustrated.

As shown in FIG. 8, the magneto-optical disk drive includes a magneto-optical disk 10, an optical head 20, an amplifier 21, a reproduction unit 26, a recording unit 25, an electromagnet 27, a control unit 28, a servo unit 29 and a motor 30. The control unit 28 controls the reproduction unit 26, the recording unit 25 and the servo unit 29 in response to a data reproduction and/or recording command provided from an external unit (not shown in FIG. 8) via a connector 32 and an interface 31.

The reproduction unit 26, which is controlled by the control unit 28 on the basis of the data reproduction command, receives a reproduced signal generated from the optical head 20 optically scanning the magneto-optical disk 10 via the amplifier 21, and decodes the reproduced signal into a signal representing a recorded signal using Viterbi decoding described later. The control unit 28 adds parity bits to the data to be recorded on the disk at an interval of a predetermined number of bits in accordance with a predetermined PARITY CHECK rule. The data may be received from the external unit. The rule used for adding the parity bits may be determined depending on a performance of the reproduction unit 26, a required quality for reproduced data and so on.

The recording unit 25, which is also controlled by the control unit 28 in response to the recording command, drives the optical head 20 based on the data being attached with the parity bit and received from the control unit 28 so that the recoding signal in conformity to the partial response PR(1,1) waveform may be recorded on the magneto-optical disk 10. When the data is recorded on the magneto-optical disk 10, the control unit 28 controls the electromagnet 27 for producing a magnetic field, which magnetizes the magneto-optical disk 10.

Figure 9:
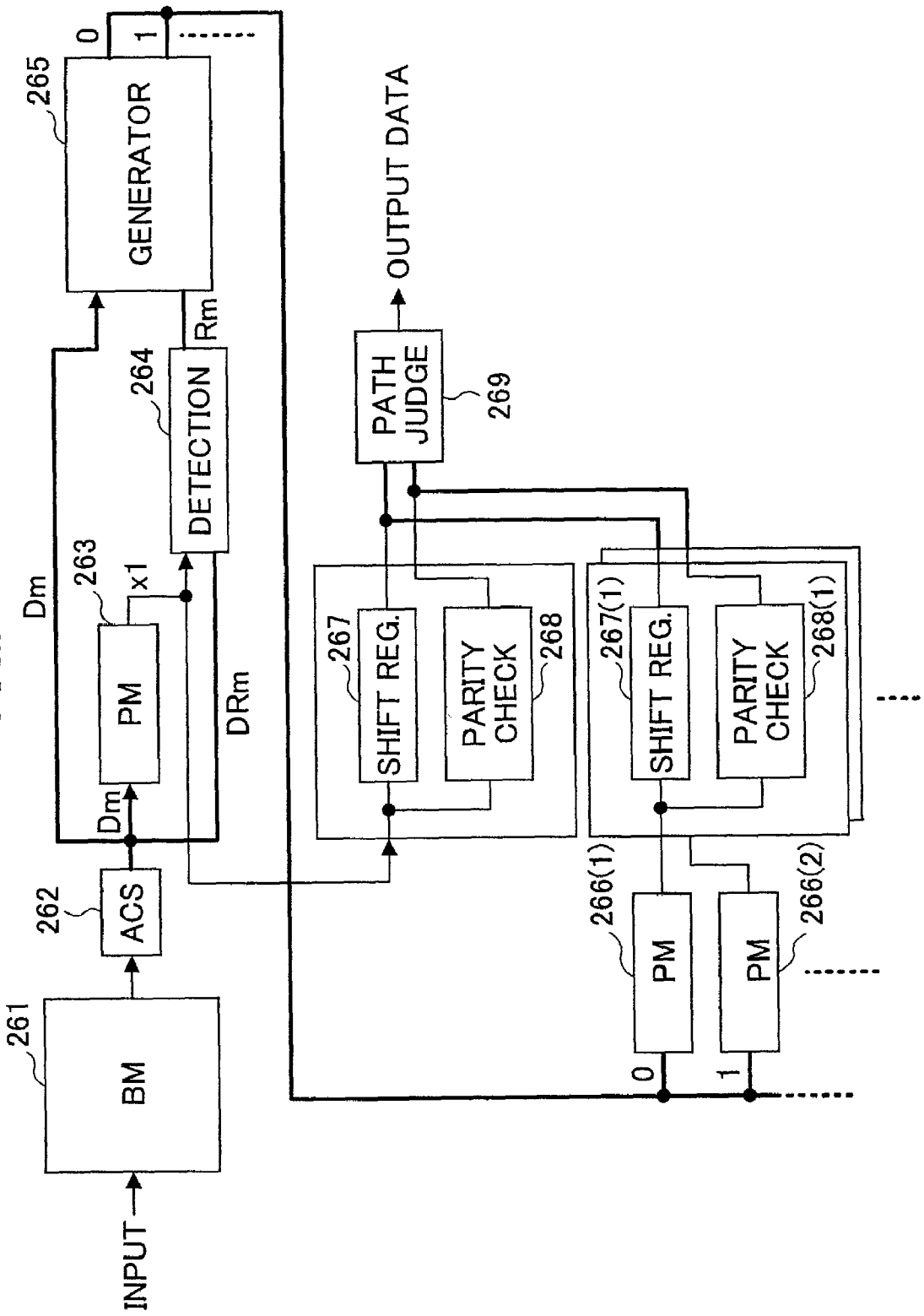
FIG. 9 shows a schematic diagram of a reproduction unit in the magneto-optical disk drive as shown in FIG. 8.

The reproduction unit 26 includes a Viterbi detector according to one embodiment of the present invention, for example, as shown in FIG. 9. The Viterbi detector operates to receive a sampled value YT derived from the reproduced signal by converting the analog reproduced signal into the digital sampled value in synchronous with a predetermined clock signal and applying waveform equalization process to the sampled value. The Viterbi detector also operates to decode the received sampled value YT into the original (recorded) data using the Viterbi decoding method. In this example, as shown in FIG. 9, the Viterbi detector may include a branch metric calculation unit (BM) 261, an add-compare-select unit (ACS) 262 and a first path memory 263, as is the case with the conventional Viterbi detector of FIG. 1. Although a path metric memory (PMM) is not shown in FIG. 9, the reproduction unit 26 of this embodiment also practically includes the PWM, as is the case with the conventional Viterbi detector of FIG. 1.

The Viterbi detector further includes a detection circuit 264, which detects a candidate for bit inversion and a generator circuit 265, which generates selected paths being inverted (hereinafter referred to as inverted-selected path), a predetermined number of second path memories 266(1), 266(2), . . . , a shift register 267 and a parity check circuit 268 corresponding to the first path memory 263, a shift register 267(1) and a parity check circuit 268(1) corresponding to the second path memory 266(1), a shift register 267(2) and a parity check circuit 268(2) corresponding to the second path memory 266(2), and so on, and a path judgment circuit 269. The Viterbi detector operates in synchronous with a clock signal with a predetermined period, for example, the clock signal having the same period as the sampling period of the reproduced signal.

The BM 261 calculates a branch metric value (BM value) representing the difference between the sampled value YT and an expected value for each of the sampled values YT being input to the BM 261. As described above, the expected value depends on the partial response waveform that has been used in recording the data on the disk, and represents a value that the reproduction signal is expected to have. As is the case with the conventional Viterbi detector, the ACS 262 in the Viterbi detector according to this embodiment calculates a path metric value (PM value) based on the BM value from the BM 261 and selects one of two possible paths reaching the same status (for example, status "0" or status "1") such that the selected one corresponds to the PM value lower than that of the other. The operation of the ACS 262 can be written as follows:

$$PM_m = \min\{PM_i + BM_j, PM_k + BM_l\}$$

and if $$PM_m = PM_i + BM_j,$$

the ACS 262 outputs $D_m = 1$ as the selected path, and else if $$PM_m = PM_k + BM_l,$$

the ACS 262 outputs $D_m = 0$ as the selected path.

In addition, the ACS 262 calculates the difference between the PM values corresponding the one path and the other path to produce a D-PM value and calculates the difference between the D-PM value and a prescribed PM decision value (hereinafter, this may be also referred to as J-PM value). Then, reliability $DR_m$ can be defined based on the calculated difference as follows:

$$DR_m = 0, \text{ for } D\text{-}PM = |PM_i + BM_j - PM_k + BM_l| < J\text{-}PM$$

$$DR_m = 1, \text{ for } D\text{-}PM = |PM_i + BM_j - PM_k + BM_l| \geq J\text{-}PM.$$

In other words, if the difference between two PM values is less than the J-PM value, then it is considered that the reliability for the path selected from these two PM values is rather low and the reliability $DR_m$ is set to be "0." Otherwise, if the difference between two PM values is equal to or more than the J-PM value, then it is determined that the reliability for the path selected from these two PM values is rather high and the reliability $DR_m$ is set to be "1." Propriety of this scheme will be supported by the following description.

Since the ACS 262 selects the least PM value among the PM values corresponding to the two paths, if the difference, D-PM value, between the selected PM value and other PM value is low, it can be determined that the selection of the path is very likely to be faulty because the difference between accuracies for these paths corresponding to the PM values is similar. To do this, the ACS 262 compares the D-PM value with the predetermined PM decision value, that is to say, the J-PM value, and determines that the selected PM value, thus the selected path, is proper if the D-PM value is above the J-PM value. This is because the accuracies for each of the two paths are significantly different. Otherwise, it is determined that the selected PM value is not proper and thus the selected path has the low reliability because the accuracies for each of the two paths are similar.

The ACS 262 provides the selected path $D_m$ to the first path memory 263, as is the case with the conventional Viterbi detector, as well as to the generator circuit 265 for generating the inverted-selected paths. The ACS 262 provides the reliability $DR_m$ for each of the paths to the detection circuit 264 for detecting a candidate to which a bit inverting operation is to be applied.

It is assumed that the PR(1,1) having a constraint length of 2 is used. There are two possible states, i.e. the status "0" and the status "1", and a total number of the paths selected from the paths reaching each of the states is equal to 2. And thus, the outputs $D_m$ and $DR_m$ of the ACS 262 is formed by 2 bits of $(D_0, D_1)$ and $(DR_0, DR_1)$ respectively, corresponding to each of the paths.

Figure 10:
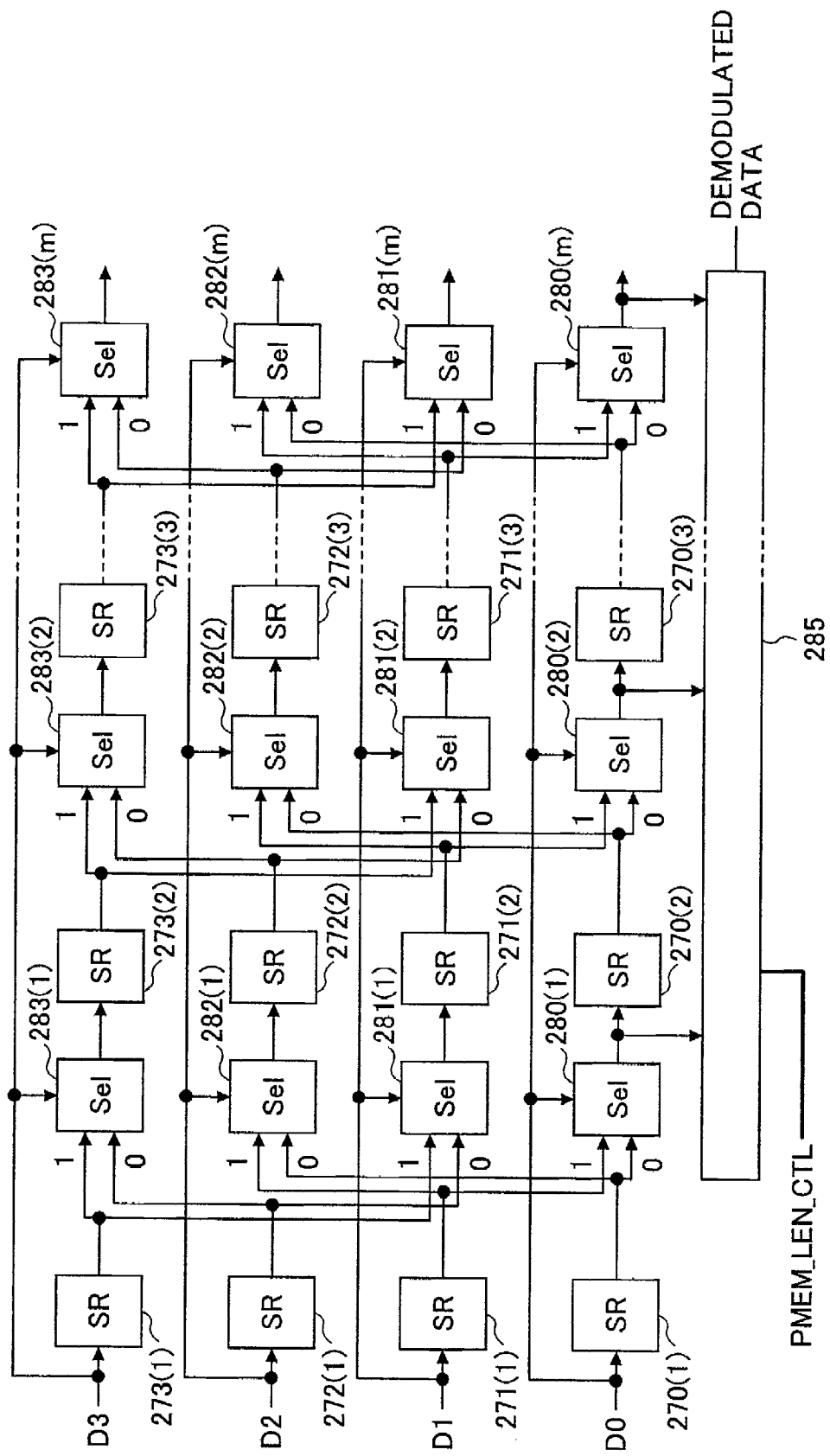
FIG. 10 shows a schematic diagram of a path memory in the reproduction unit as shown in FIG. 9.

In the case of the PR(1,1) class having the constraint length of 3, there are four possible states and the total number of the paths selected from the paths reaching each of the states is equal to 4. Therefore, the outputs $D_m$ and $DR_m$ of the ACS 262 are formed by 4 bits of $(D_0, D_1, D_2, D_3)$ and $(DR_0, DR_1, DR_2, DR_3)$, respectively, corresponding to each of the paths. FIG. 10 shows a schematic diagram of one example of the first path memory 263 used with the PR(1,1) class with the constraint length of 3.

With reference to FIG. 10, the first path memory 263 includes four registers 270(1), 271(1), 272(1) and 273(1) for setting each bit of the data $D_m$, that is to say $D_0$, $D_1$, $D_2$ and $D_3$, representing the selected paths output from the ACS 262. The first path memory 263 also includes a selector 280(1) for selecting between the values being loaded into the registers 270(1) and 271(1) on the basis of the value of $D_0$, a selector 281(1) for selecting between the values being loaded into the registers 272(1) and 273(1) on the basis of the value of $D_1$, a selector 282(1) for selecting between the values being loaded into the registers 270(1) and 271(1) on the basis of the value of $D_2$, and a selector 283(1) for selecting between the values being loaded into the registers 272(1) and 273(1) on the basis of the value of $D_3$. Thus, the four registers 270(1), 271(1), 272(1) and 273(1) and the four selectors 280(1), 281(1), 282(1) and 283(1) comprise a first stage. The first path memory 263 further includes a second stage connected in series with the first stage and formed by four registers 270(2), 271(2), 272(2) and 273(2) and four selectors 280(2), 281(2), 282(2) and 283(2), and further stages each similarly formed by four registers 270(m), 271(m), 272(m) and 273(m) and four selectors 280(m), 281(m), 282(m) and 283(m) are connected in series.

The first path memory 263 includes a circuit 285 for selecting a number of output stages. This circuit 285 receives selected values from the selector 280(1), 280(2), . . . , and 280(m) in each of the stages and delivers the selected values from either one of the selectors as demodulated data in response to a selecting signal PMEM_LEN_CTL from the control unit 28 (FIG. 8).

In the thus constructed first path memory 263, the bit value representing the selected path $D_m$, which is sequentially passed by the ACS 262, is selected and shifted by the selectors and the registers, respectively, which are connected in series. Each of the selectors is configured to select the value such that the paths, which are not adequate to be selected, are rejected on the basis of the connectivity of the transient states. Then, the first path memory 263 can generate the bit value corresponding to a survival path or a survivor.

The various partial responses (PR) may contribute to the data differently, and thus varying a length of the path memory or the number of the stages included in the path memory, required for establishing the survivor. To do this, the control unit 28 provides to the circuit 285 for selecting a number of output stages, the selecting signal PMEM_LEN_CTL indicating the expected number of the stages by means of which the data can be established. The circuit 285 selects the bit value corresponding to the survivor output from the selector 280(i) (i=1, . . . , m), when the selected number of the output stages is equal to i, and the circuit 285 provides the bit value as the demodulated data.

In this configuration according to the embodiment of the present invention, the demodulated data can be available at an output the first path memory 263 with very less delay time at the beginning of the reproduction process.

Thus derived demodulated data or bit data from the first path memory 263 are passed as a first candidate data X1 to the detection circuit 264 for detecting candidate data to be inverted, the shift register 267 and the parity check circuit 268.

The detection circuit 264 inputs the first candidate data X1 and the reliability $DR_m$ corresponding to each of the paths from the ACS 262 and outputs the candidate data $R_m$ to be inverted. The candidate data $R_m$ to be inverted are produced by a below described process.

Firstly, a relevant path (hereinafter, also referred to as a last selected path) that has been finally selected on the basis of the first candidate data X1 is determined. Thereafter, the candidate data $R_m$=1, which corresponds to the path having the least reliability $DR_m$=0 (low reliable), is produced from the last selected paths and the candidate data $R_m$=0, which corresponds to the path having the highest reliability $DR_m$=1 (high reliable), is produced from the last selected paths. Then, the last selected path corresponding to $R_m$=1 is determined to be a candidate path to be inverted.

In the ACS 262, for example, it is assumed that the paths $D_m$ ($D_0$, $D_1$), which are designated by a broken arrow and a solid arrow in FIG. 11A, are selected and the reliability $DR_0$ corresponding to the path extending from the status "0" at the time of 9T to the status "0" takes the value of 0 (i.e. $DR_0$=0). In this case, if the path $D_m$ is included in the last selected path corresponding to the first candidate data X1 depicted as a bold line in FIG. 11B, the candidate data $R_0$=1 to be inverted is produced for the path $D_0$ extending from the states "0" at the time of 9T to the states "0."

Figure 12:
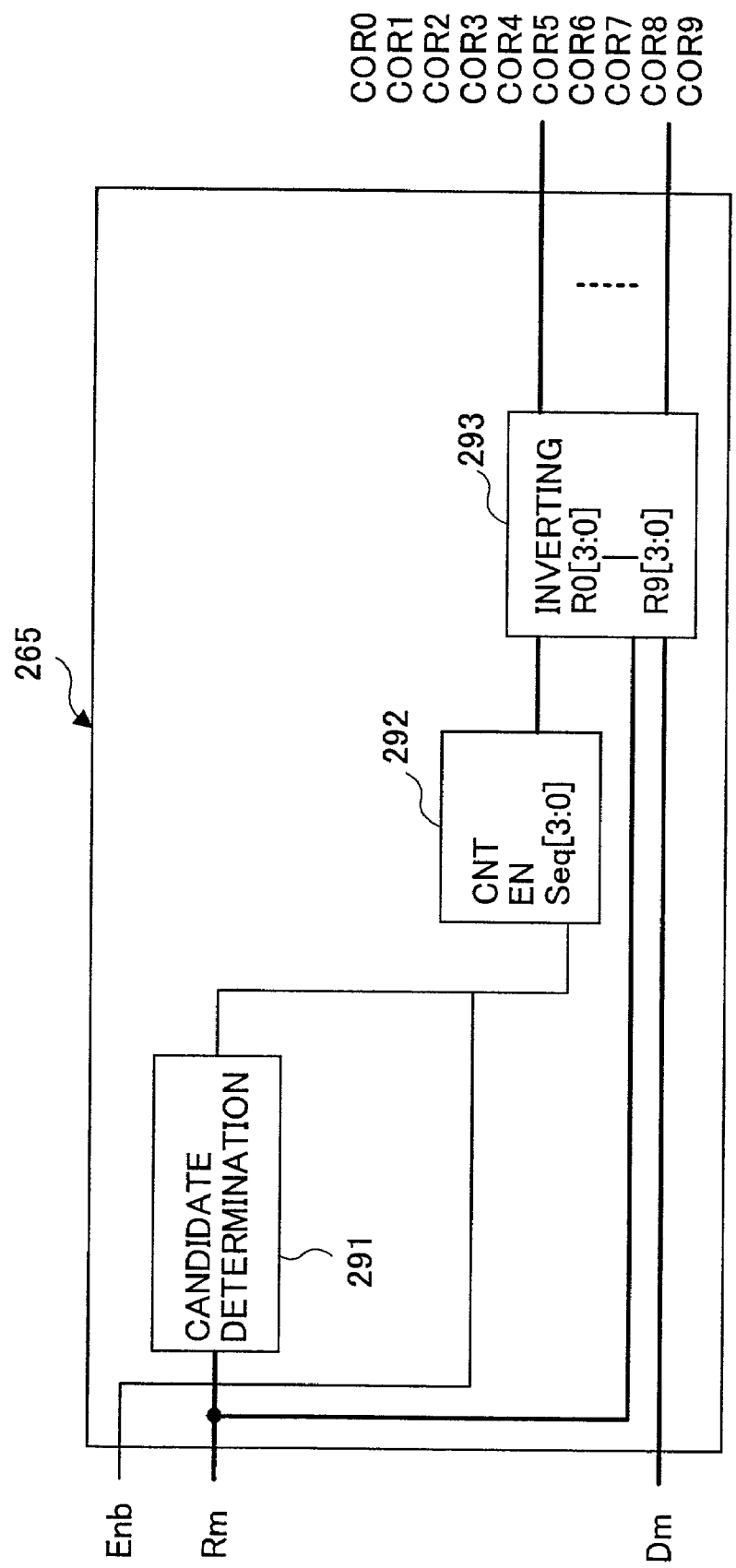
FIG. 12 shows a schematic diagram of a circuit for generating an inverted-selected path.

FIG. 12 shows a schematic diagram of an example of the generator circuit 265 for inverting the selected path and generating the inverted-selected path.

With reference to FIG. 12, the generator circuit 265 includes a circuit 291 for determining a candidate bit to be inverted, a counter 292 and an inverting circuit 293. The circuit 291 for determining the candidate bit to be inverted inputs the candidate data $R_m$ to be inverted from the detection circuit 264 and determines whether the candidate data $R_m$ to be inverted, for example $R_0$ or $R_1$, includes a value 1, which represent that the data includes the bit to be inverted.

The counter 292 is activated by an enabling signal Enb from the control unit 28 and is incremented by one at each time the circuit 291 passes a result representing that the candidate data $R_m$ to be inverted includes the value 1, which means that the data may be inverted. The inverting circuit 293 receives the selected path $D_m$ and the candidate data $R_m$ from the ACS 262 and a counted value of the counter 292, and generates and outputs ten inverted-selected paths COR0, COR1, . . . , COR9, for example, in parallel from ten output-ends, respectively, if the counter's value varies from 0 to 9.

The inverting circuit 293 normally outputs the input selected path $D_m$ directly as the inverted-selected paths COR0, . . . , COR9 from the 10 output-ends. However, each time when the inverting circuit 293 receives the candidate data $R_m$ including the value 1 representing the presence of the candidate bit to be inverted, the inverting circuit 293 inverts the path corresponding to the candidate data $R_m$ and output the inverted path as the value of the inverted-selected path $COR_{i-1}$. More precisely, the inverting circuit 293 replaces the value of one path corresponding to the candidate data $R_m$=1 among the selected paths output from the output-end specified by the count i of the counter 292, with the value of the other path reaching the same status as the one path.

Figure 13A:
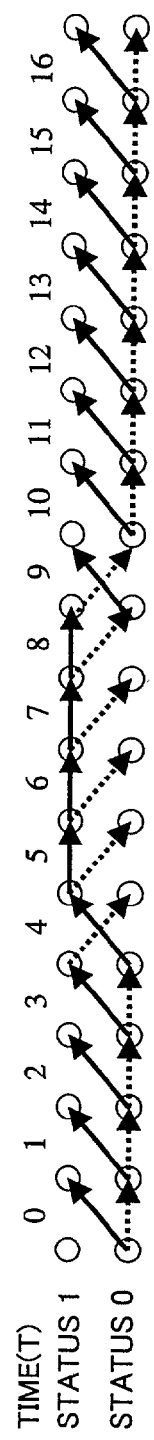
FIG. 13 illustrates the relation between the inverted-selected path in the circuit of FIG. 12 and the last selected path from the selected paths.

For example, at each time of time series shown in FIG. 11A, the value of each selected paths, which are depicted as the solid arrow and the broken arrow, are output from each of the output-ends as the inverted-selected paths COR0, COR1, . . . , COR9. At the time of 9T, there exist one path (depicted as the broken arrow) going from the status "0" to the status "0" and the other path (depicted as the solid arrow) going from the status "0" to the status "1."Among these paths, the one path corresponding to the candidate data $R_m$=1 to be inverted is modified by the path going from the status "1" to status "0", as shown in FIG. 13A at the time of 9T by the broken arrow, and the values corresponding to the path going from the status "1" to the status "0" (broken arrow) and the path going from the status "0" to the status "1" (solid arrow), respectively, are output as the inverted-selected path $COR_i$ at the time of 9T from the inverting circuit 293.

Figure 14:
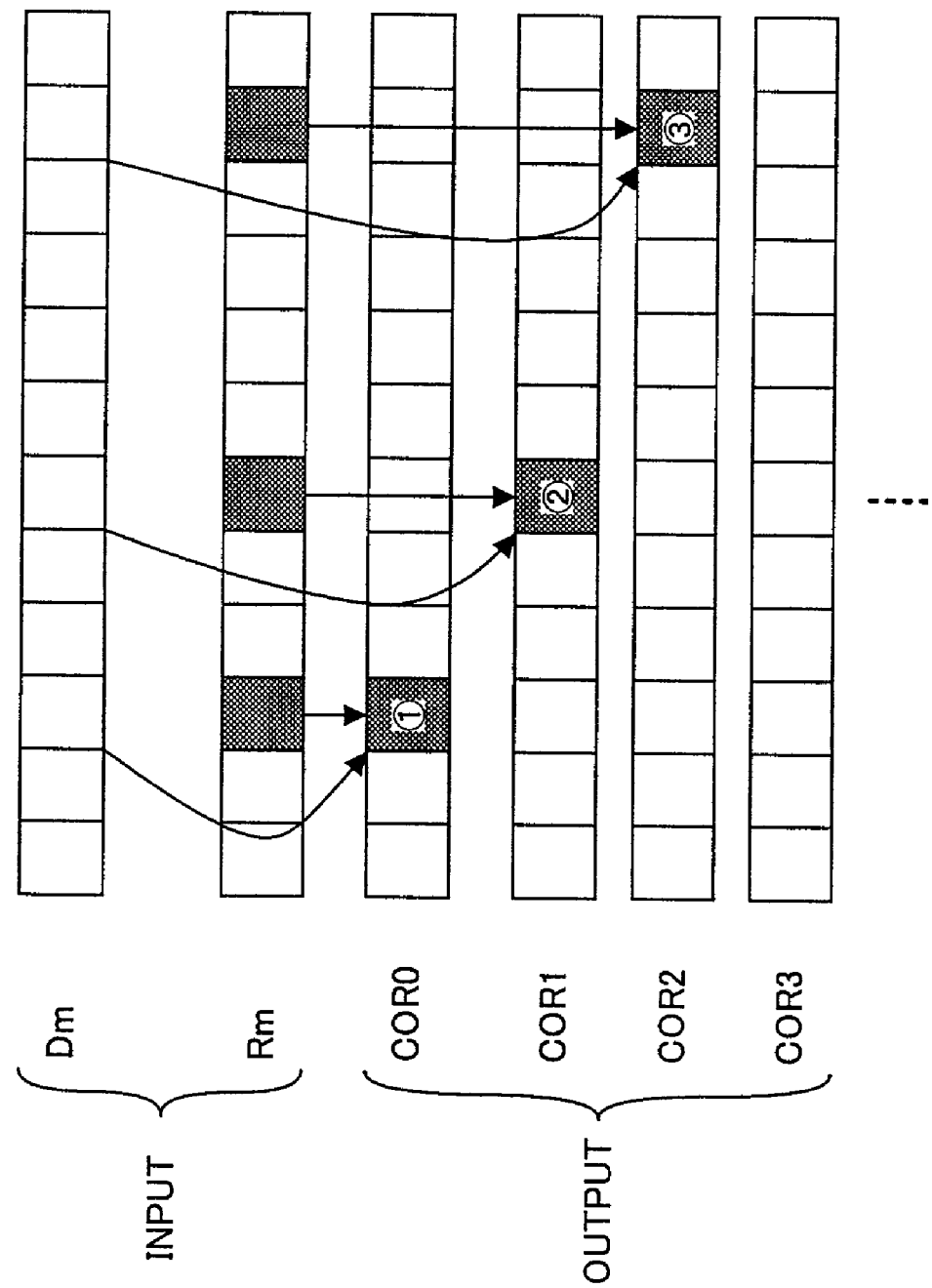
FIG. 14 illustrates an example of each status of the inverted-selected paths generated in the circuit of FIG. 12.

The process carried out by the generator circuit 265 for generating the inverted-selected paths is executed for N bits of the selected paths, where N is the number of bits subject to parity check. For example, as shown in FIG. 14, each time it is determined that the candidate path to be inverted is present ($R_m=1$), the inverted-selected path is sequentially output from the output-end corresponding to the inverted-selected path COR0 after a part of the selected path $D_m$ is changed or inverted. That is to say, the inverted-selected path $COR_0$ is output from the first output-end where the first candidate path ($R_m=1$) to be inverted is modified as marked by ① in FIG. 14, the inverted-selected path $COR_1$ is output from the second output-end where the second candidate path ($R_m=1$) to be inverted is modified as marked by ② in FIG. 14, the inverted-selected path $COR_2$ is output from the third output-end where the third candidate path ($R_m=1$) to be inverted is modified as marked by ③ in FIG. 14. Consequently, up to 10 inverted-selected paths are supplied from the output-ends corresponding to the selected path $COR_1, \ldots, COR_9$. If the number j of the candidate path to be inverted is lower than the most possible number 10, then the inverted-selected path $COR_1$ to $COR_j$ are inverted and the remaining inverted-selected paths $COR_{j+1}$ to $COR_9$ are not changed and equivalent to the selected paths $D_m$.

Figure 13B:
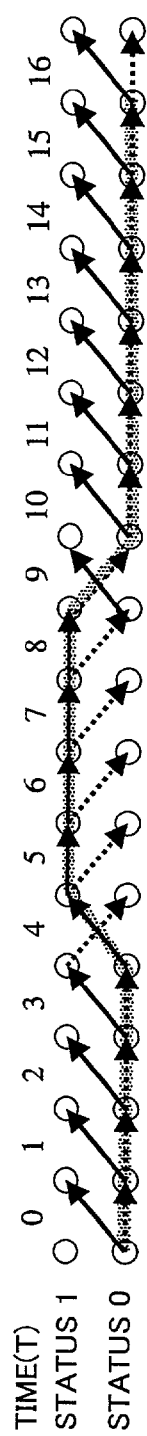

The second path memories 266(1), 266(2), . . . are provided such that the number of the second path memories are equal to the number of the inverted-selected paths $COR_0, \ldots, COR_9$ and each inverted-selected path $COR_i$ is passed to the corresponding second path memory 266(i). Each second path memory 266(i) is similarly constructed as the first path memory 263 and receives the inverted-selected path $COR_i$ and sequentially selects and shifts the bit value representing the inverted-selected path $COR_i$. During the selection and shift of the bit value, each of the second path memory 266(i) is operable to select the value so that the paths that are not adequate to be selected are rejected on the basis of the connectivity of the transient states. And thus, each second path memory 266(i) will generate the bit value corresponding to the survival path or the survivor. For example, the second path memory 266(i) receives the bit value representing the inverted-selected path $COR_i$, as shown in FIG. 13A, and the second path memory 266(i), as shown in FIG. 13B, generates second candidate data X2i (depicted by the bold line) corresponding to the derived survivor on the basis of the connectivity of the transition states of the path.

The first candidate data X1 from the first path memory 263 are provided to the shift register 267 and sequentially shifted therein. Simultaneously, for each of the N bits of the first candidate data X1, the parity check circuit 268 applies a parity check operation to each set of N bits of the first candidate data X1 on the basis of the above-described PARITY CHECK rule. Then, the parity check circuit 268 provides a Prtyok signal representing a result of the parity check for each set of the N bits of the first candidate data X1.

Each of the second path memories 266(i) is followed by the shift register 267(i) and the parity check circuit 268(i) and the second candidate data X2i are sequentially shifted by the relevant shift register 267(i). Simultaneously, the parity check circuit 268 (i) applies the parity check operation to each set of the N bits of the second candidate data X2i and provides the result Prtyok of the parity check for each set of the N bits of the second candidate data $X2_i$.

The path judgment circuit 269 inputs the first candidate data X1 sequentially output from the shift register 267, each of the second candidate data $X2_i$ output from the corresponding shift register 267(i), the result from the parity check circuit 268 and each of the results from the corresponding parity check circuit 268(i). Then, the path judgment circuit 269 selects the N bits either the first candidate data X1 or the second candidate data $X2_i$ on the basis of the results from the parity check circuits 268 and 268(i), and delivers the selected N bits as the output data.

Figure 15:
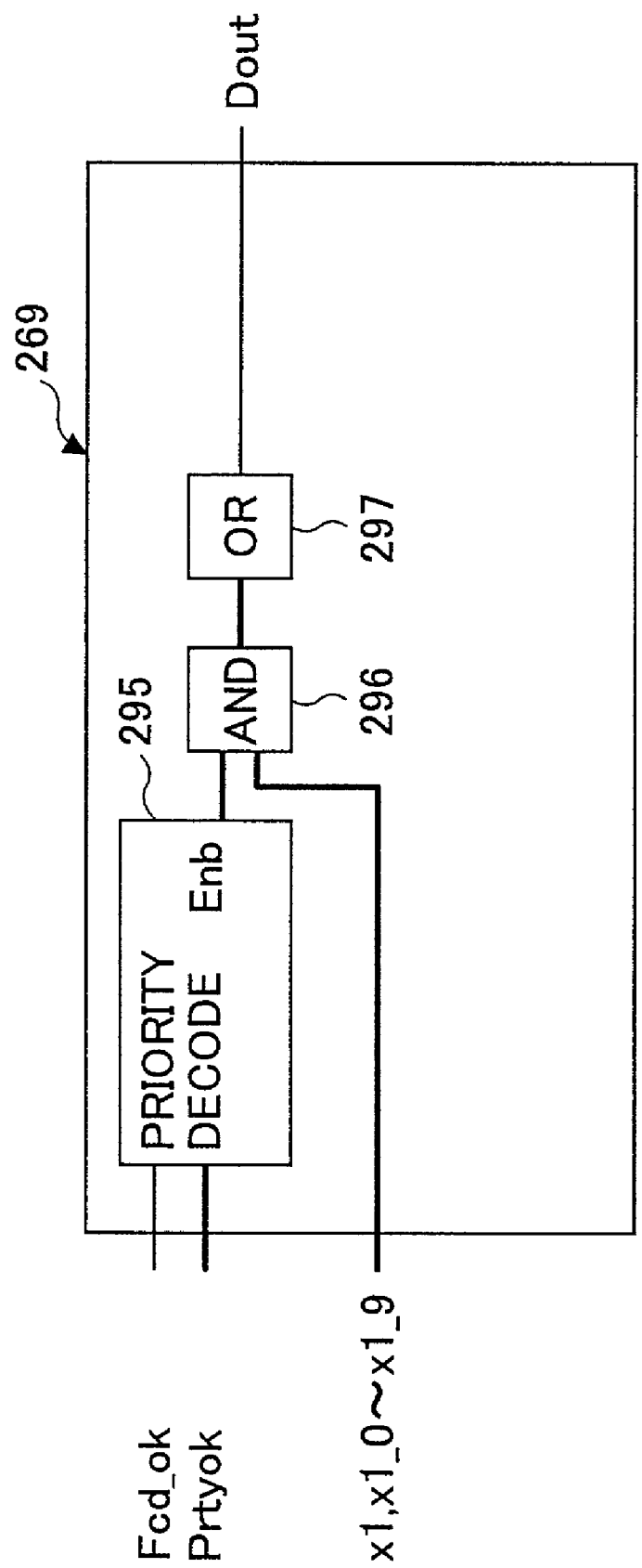
FIG. 15 shows a schematic diagram of a path judgment circuit in the reproduction unit as shown in FIG. 9.

FIG. 15 shows a schematic diagram of the path judgment circuit 269 according to one embodiment of the present invention.

With reference to FIG. 15, the path judgment circuit 269 includes a parity decoding circuit 295, an AND logic 296, and an OR logic 297. The parity decoding circuit 295 receives the Prtyok signals representing the results of the parity check processes from the parity check circuits 268 and 268(i) and an enable control signal Fcd_ok from the control unit 28 (FIG. 8), and produces a selection control signal Enb in response to those received signals. The AND logic 296 has 11 AND gates, each AND gate having a first input to which each of the first candidate data X1 and the plurality of the second candidate data $X2_0$ to $X2_9$ is coupled and a second input to which each bit of the selection control signal Enb comprising 11 bits from the parity decoding circuit 295 is coupled.

For example, the parity decoding circuit 295 produces the selection control signal Enb in accordance with an input/output relation as shown in a table of FIG. 16.

If the control unit 28 provides the enable control signal Fcd_ok of "1", the parity decoding circuit 295 will produce the selection control signal Enb=(00_0000_0000_1) allowing the first candidate data X1 to be selected irrelevant to the parity check result of the first candidate data X1 from the parity check circuit 268 and that of the second candidate data X2i from the parity check circuit 268(i). This allows only the AND gate that receives the first candidate data X1 in the AND logic 296 to be activated and the first candidate data X1 is output from the path judgment circuit 269 as a decoded data DOUT via that AND gate and the OR logic 297.

Figure 1:
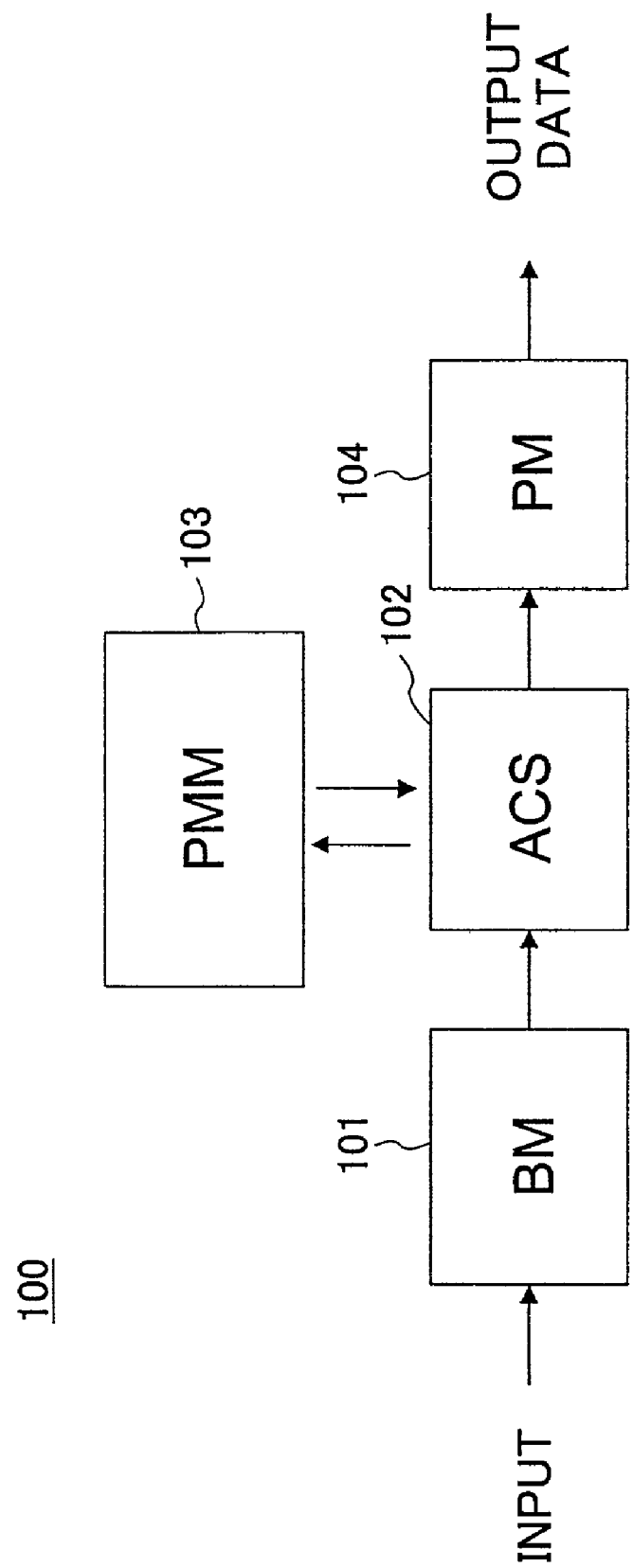
FIG. 1 shows a block diagram of an example of a Viterbi detector.
Figure 2:
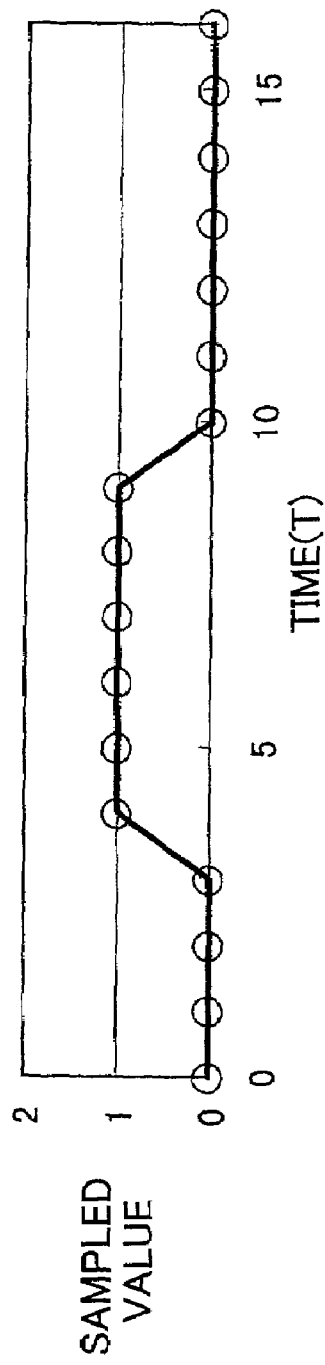
FIG. 2 illustrates an example of sampled values of a reproduction signal corresponding to PR(1,1)
Figure 3:
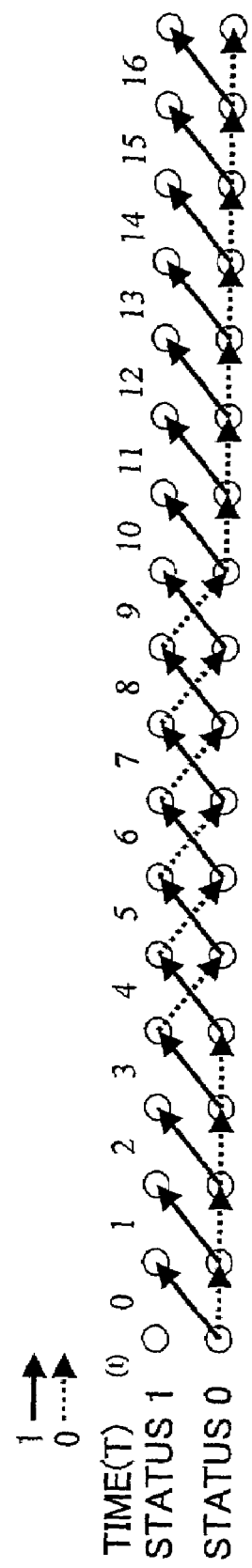
FIG. 3 illustrates an example of the relation between a selected path in an ACS and states.
Figure 4:
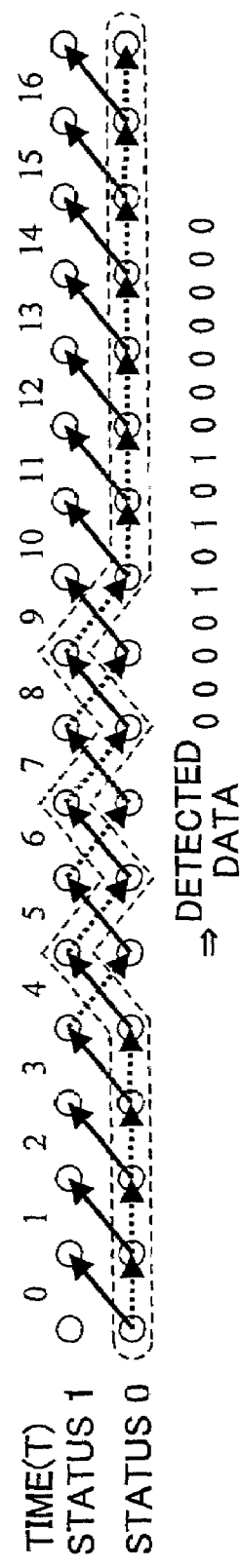
FIG. 4 illustrates an example of a survivor established in a PM.
Figure 5:
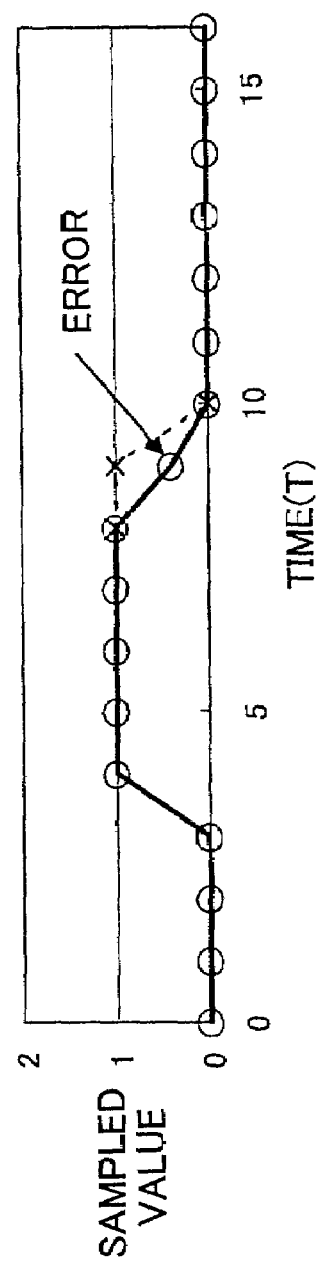
FIG. 5 illustrates an example of the sampled values of the reproduction signal corresponding to PR(1,1) where the produced signal is susceptible to noise.

In this example, since any information derived from the candidate for inversion is not take into account, the path judgment circuit 296 of the reproduction unit will output directly the first candidate data X1, which has been extracted from the sampling value YT using the Viterbi decoding algorithm as the decoded data DOUT, as is the case with the conventional Viterbi detector (FIG. 1).

However, it is assumed that the control unit 28 provides the enable control signal Fcd_ok of "0", and both of the parity check result of the first candidate data X1 from the parity check circuit 268 and that of the second candidate data X2i from the parity check circuit 268(i) are "0s", where "0" means that the candidate data are faulty. This may be expressed as Prtyok[10:0]=00_0000_0000_0. Then, the parity decoding circuit 295 would generate the selection control signal Enb=(00_0000_0000_1) for selecting the first candidate data X1. In this case, the path judgment circuit 296 will output directly the first candidate data X1 as the decoded data DOUT.

Thus, it can be said that if both of the first candidate data X1 and each of the second candidate data $X2_i$ give the parity check results of faults, the first candidate data X1 is considered to be more reliable than the second candidate data $X2_i$ and output as the decoded data DOUT.

In addition, if the control unit 28 provides the enable control signal Fcd_ok of "0", and the parity check result of the first candidate data X1 from the parity check circuit 268 is "1", which indicates no faults occur, then the parity decoding circuit 295 will produce the selection control signal Enb=(00_0000_0000_1) allowing the first candidate data X1 to be selected, irrelevant to the parity check result of each of the second candidate data $X2_i$ (Prtyok[10:0]=xx_xxxx_xxxx_1) from the parity check circuit 268(i). In this case, the first candidate data X1 is also directly provided as the decoded data DOUT.

If the control unit 28 provides the enable control signal Fcd_ok of "00", the parity check result of the first candidate data X1 from the parity check circuit 268 is "0" (with fault), and the parity check result of a first occurrence of the second candidate data $X2_0$ from the parity check circuit 268(1) is "1" (without fault), then the parity decoding circuit 295 will produce the selection control signal Enb=(00_0000_0001_0) allowing the first occurrence of the second candidate data $X2_0$ to be selected, irrelevant to the parity check result of the rest of the second candidate data $X2_1$ to $X2_9$ (Prtyok[10:0]=xx_xxxx_xxx1_0) from the parity check circuit 268(i). This allows only the AND gate that receives the first occurrence of the second candidate data $X2_0$ in the AND logic 296 to be activated and the first occurrence of the second candidate data $X2_0$ is output from the path judgment circuit 269 as the decoded data DOUT via that AND gate and the OR logic 297.

If the control unit 28 provides the enable control signal Fcd_ok of "0", the parity check result of the first candidate data X1 from the parity check circuit 268 is "0" (with fault), the parity check result of the first occurrence of the second candidate data $X2_0$ from the parity check circuit 268(1) is "0" (with fault), and the parity check result of a second occurrence of the second candidate data $X2_1$ from the parity check circuit 268(2) is "1" (without fault), then the parity decoding circuit 295 will produce the selection control signal Enb=(00_0000_0010_0) allowing the second occurrence of the second candidate data $X2_1$ to be selected, irrelevant to the parity check results of the rest of the second candidate data $X2_2$ to $X2_9$ (Prtyok[10:0]=xx_xxxx_xx10_0) from the parity check circuit 268(i). This allows only the AND gate that receives the second occurrence of the second candidate data $X2_1$ in the AND logic 296 to be activated and the second occurrence of the second candidate data $X2_1$ is output from the path judgment circuit 269 as the decoded data DOUT via that AND gate and the OR logic 297.

This can be described more generally. If the control unit 28 provides the enable control signal Fcd_ok of "0", the parity check result of the first candidate data X1 from the parity check circuit 268 is "0" (with fault), the parity check results from the first occurrence of the second candidate data $X2_0$ to the $j^{th}$ of the second candidate data $X2_{j-1}$ from the parity check circuits 268(1) to 268(j) are all "0s" (with fault), and the parity check result of a $(j+1)^{th}$ of the second candidate data $X2_j$ from the parity check circuit 268(j+1) is "1" (without fault), then the parity decoding circuit 295 will produce the selection control signal Enb=(00_0 ... 1 ... 00_0) allowing the $(j+1)^{th}$ of the second candidate data $X2_j$ to be selected, irrelevant to the parity check results of the rest of the second candidate data $X2_{j+1}$ to $X2_9$ (Prtyok[10:0]=xx_x ... 1 ... 00_0) from the parity check circuit 268(j+2) to 268(10). This allows only the AND gate that receives the $(j+1)^{th}$ of the second candidate data $X2_j$ in the AND logic 296 to be activated and the $(j+1)^{th}$ of the second candidate data $X2_j$ is output from the path judgment circuit 269 as the decoded data DOUT via that AND gate and the OR logic 297.

Thus, the path judgment circuit 269 outputs as the decoded data DOUT either the first candidate data X1 or the second candidate data $X2_i$ associated with the parity check results without fault. Furthermore, the path judgment circuit 269 is operable to prefer the first candidate data to the second candidate data, and prefer the second candidate data $X2_i$ having a smaller index i to the following second candidate data $X2_j$ (j>i) among the second candidate data.

As described above, according to the embodiments of the present invention, the first candidate data X1 are generated from the selected path $D_m$ and the second candidate data $X2_i$ are generated from the last selected paths based on the first candidate data X1 by modifying or inverting the low reliable path among the last selected paths corresponding to the first candidate path in order to achieve the inversed-selected path. Then, the candidate data for which the result of the parity check does not include the fault is output as the decoded data DOUT. Therefore, it is advantageous that the data reproduction unit 26, which can detect the data at the higher efficiency and can be less susceptible to the noise, can be achieved.

Figure 17:
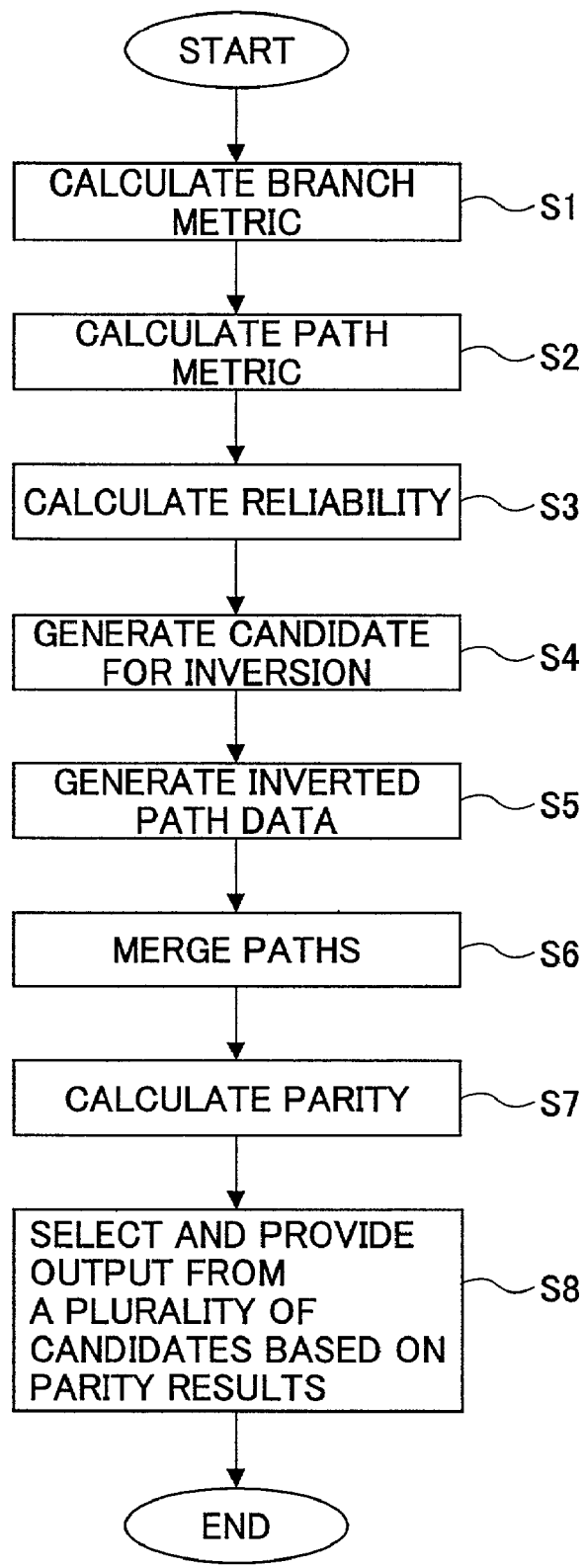
FIG. 17 shows a flow of an example of the process performed by the reproduction unit of FIG. 9.

The above described reproduction unit 26 is capable of recovering the data, for example the first candidate data X1, from the sampled value YT of the reproduced signal in synchronous with the predetermined clock signal, as is the case with the conventional Viterbi detector, and is also capable of processing the information involving the above-mentioned candidate data to be inversed and produce the final decoded data in synchronous with the predetermined clock signal, according to one example of the process, as illustrated as a flow in FIG. 17.

The operation of the reproduction unit will be explained with reference to FIG. 17. The BM 261 calculates the BM (branch metric) value on the basis of the sampled value YT being provided at a predetermined period (step 1). Then, the ACS 262 calculates the PM (path metric) value based on the calculated BM value (step 2). The ACS 262 calculates the reliability $DR_m$ based on the PM value (step 3). The detection circuit 264 for detecting the candidate bit to be inverted produces the candidate data $R_m$ to be inverted on the basis of the first candidate data X1 and the reliability $DR_m$ (step 4) and the generator circuit 265 for generating the selected paths being inverted generates the inverted-selected paths COR0 to COR9 based on the candidate data $R_m$ to be inverted and the selected path (step 5).

Thereafter, using each of the inverted-selected paths COR0 to COR9, each of the second path memories 266(i) performs path merging in parallel (step 6), and produces the second candidate data $X2_i$. Next, each of the parity check circuits 267 and 267(i) applies the parity check operation to the first candidate data X1 and each of thus produced second candidate data $X2_i$ (step 7), and the path judgment circuit 269 selects one of the first candidate data X1 and the second candidate data $X2_i$ on the basis of the results of the parity check operation and outputs the selected candidate data as the decoded data DOUT (step S8).

In the reproduction unit 26 of which the process has been explained, after a plurality of the inverted-selected paths are produced, the operation is applied to each of the inverted-selected paths in parallel, so that the second candidate data $X2_i$ is generated for each of the inverted-selected paths. Then, the parity check operation is applied both to the first candidate data X1 and the second candidate data $X2_i$ in parallel, and the one candidate data is determined as the decoded data DOUT on the basis of the results of the parity check. Using this operation of the reproduction unit 26, the reproduction unit 26 can execute the operation in synchronous with a common clock signal, and thus minimizing an amount of the information remaining without being completely processed within the reproduction unit. Therefore, the reproduction unit according to the embodiments of the present invention has an advantage that the faster, more accurate data reproduction can be achieved.

Although, in the above examples, the second candidate path $X2_i$ is generated from the inverted-selected paths by selecting and modifying the path having the candidate to be inverted such as $R_m=1$ (i.e., the low reliable path) one by one among the selected paths $D_m$, it is apparent that the present invention is not limited to these examples, and that the candidate paths to be inverted may be inverted two by two, three by three, or all together, such that the second candidate data are generated from the inverted-selected paths, which are produced by modifying the plurality of the candidate paths to be inverted.

Furthermore, although, in the above-described embodiments, the parity check is used for estimating propriety for each of the candidate data, any other methods such as ECC (Error Correcting Code) method may be utilized to estimate the propriety for each of the candidate data.

In the above-described embodiments, although the number of the bits to be subject to the parity check is fixed to N, the number of the bits, N, may be variable in accordance with the PARITY CHECK rule. In this case, the reproduction unit 26 is arranged such that the control unit 28 provides the information indicating the variable number of the bits, N, to each of the shift registers 267 and 267($i$) and each of the parity check circuits 268 and 268($i$). Accordingly, a control timing of each of the shift registers 267 and 267($i$) and each of the parity check circuits 268 and 268($i$) is changed.

In the above embodiments, the magneto-optical disk drive having both functions of recording the data on the disk and reproducing the data from the disk is described and shown to explain the data production device according to the present invention, however, these embodiments are only illustrative and the present invention may be applied to the magneto-optical disk having the single function of reproducing the data from the disk. Furthermore, the present invention may be applied to the data reproduction device, rather than the magneto-optical disk, including, for example, an optical disk drive using an optical disk such as CD, MD, and so on as a recording medium, as well as a magnetic disk drive using a magnetic disk such as hard disk, flexible disk, and so on as the recording medium.

In the above-described embodiments, a part of functions of the ACS 262 may be reliability calculation means, the first path memory 263 corresponds to first candidate data generation means, the detection circuit 264 for detecting the candidate for the bit inversion may be inverted candidate detection means, the generator circuit 265 for generating the selected paths being inverted may be inverted-selected path generation means, and the plurality of the second path memories 266(1), 266(2), . . . may be second candidate data generation means. Each of the second path memories 266($i$) may be a path generation circuit.

Furthermore, the plurality of the parity check circuits 268 and 268($i$) may be error detection means and the path judgment circuit 269 may be data selection means.

The counter 292 of FIG. 12 may be output specifying means and the inverting circuit 293 may be path-inverting means. The table shown in FIG. 16 may be a table representing the relation between results of the error detection for the first and the second candidate data and the candidate date to be selected.

The present invention is not limited to the specifically disclosed embodiments, and variations and modifications may be made without departing from the scope of the invention.

The present application is based on Japanese priority application No. 2001-336802 filed on Nov. 1, 2001, the entire contents of which are hereby incorporated by reference.

What is claimed is:

1. A data reproduction device reproducing data from a recording medium including:
   a sampling part sampling a reproduced signal in a form of a partial response waveform from the recording medium at a predetermined period; and
   a decoding part in conformity to Viterbi decoding, receiving the sampled signal, calculating a branch metric value on the basis of an expected value determined by the partial response waveform and the sampled value, calculating a path metric value based on the branch metric value, selecting a path corresponding to a transition status of the data on the basis of comparison of the path metric values, and reproducing the data in accordance with the selected path;
   the decoding part further includes:
   a reliability calculation part calculating a reliability of the selected path based on the path metric values being compared in selecting the path;
   a first candidate data generation part for generating first candidate data based on the selected path using a predetermined rule;
   an inverted candidate detection part selecting as an inverted candidate the path of which the reliability calculated in said reliability calculation part is less than a predetermined value among the selected paths corresponding to the first candidate data;
   an inverted-selected path generation part receiving the selected path and the inverted candidate selected by said inverted candidate detection part, selecting and modifying the selected path corresponding to the inverted candidate so as to produce a inverted-selected path that is an inverted version of the selected path, and outputting a number of the inverted-selected paths in parallel, said number corresponding to a number of the inverted candidates selected for the selected path of a predetermined data length;
   a second candidate data generation part generating second candidate data from the inverted candidate output from said inverted-selected detection part using said predetermined rule and outputting said generated second candidate data in parallel;
   a error detection part detecting any errors present in the first and the second candidate data in accordance with a predetermined error detecting; and
   a data selection part selecting between the first and the second candidate data based on the error detecting results from said error detection part.

2. The data reproduction device as claimed in claim 1, wherein said reliability calculation part includes a difference value calculation part for calculating a difference of the path metric values so as to produce information representing the reliability.

3. The data reproduction device as claimed in claim 1, wherein said inverted-selected path generation part is configured to produce the inverted-selected path that reaches the same transition status as that of the selected path to be modified.

4. The data reproduction device as claimed in claim 1, wherein said inverted-selected path generation part include:
   a predetermined number of output-ends;
   an output specifying part specifying the output-ends in a predetermined sequential order at the time of receiving the inverted candidate from said inverted candidate detection part so as to sequentially output the inverted-selected path; and a path-inverting part modifying the selected path corresponding to the inverted candidate so as to produce the inverted version of the selected path.

5. The data reproduction device as claimed in claim 4, wherein said second candidate data generation part includes data generation circuits, each being connected to the corresponding output-end of said inverted-selected path generation part, and each of said data generation circuits generates the second candidate based on the inverted-selected path received from the inverted-selected path generation part via said corresponding output-end.

6. The data reproduction device as claimed in claim 1, wherein said data selection part is provided with a look up table representing the relation between the error detecting results for the first and the second candidate data and the candidate data to be selected and is configured to select and output the candidate data depending on the error detecting results from said error detection part.

7. The data reproduction device as claimed in claim 1, wherein said data selection part is configured to select the first candidate data when said error detection part detects the error in all of the first and the second candidate data.

8. The data reproduction device as claimed in claim 1, wherein said data selection part is configured to select the first candidate data depending on a given control signal and independent of the error detecting results from said error detection part.

9. The data reproduction device as claimed in claim 1, wherein said data selection part is configured to select the first candidate data irrelevant to the error detecting results for the second candidate data from said error detection part when said error detection part detects no errors in the first candidate data.

10. The data reproduction device as claimed in claim 1, wherein said data selection part is configured to select one of the second candidate data in accordance with a predetermined priority when said error detection part detects the error in the first candidate data and detects no errors in a plurality of the second candidate data.

11. The data reproduction device as claimed in claim 1, wherein said error detection part is configured to detect the errors in the first and the second candidate data using parity check.

* * * * *